United States Patent
Butler

(10) Patent No.: US 6,507,240 B2
(45) Date of Patent: Jan. 14, 2003

(54) HYBRID AUDIO AMPLIFIER

(76) Inventor: Brent K. Butler, 6806 S. Norfolk St., Foxfield, CO (US) 80016

( * ) Notice: Subject to any disclaimer, the term of this patent is extended or adjusted under 35 U.S.C. 154(b) by 18 days.

(21) Appl. No.: 09/780,052

(22) Filed: Feb. 9, 2001

(65) Prior Publication Data

US 2002/0109544 A1 Aug. 15, 2002

(51) Int. Cl.$^7$ ............................................. H03F 5/00
(52) U.S. Cl. ........................................... 330/3; 330/119
(58) Field of Search ............................... 330/3, 118, 119, 330/122, 123, 262, 263

(56) References Cited

U.S. PATENT DOCUMENTS

| | | |
|---|---|---|
| 3,353,109 A | 11/1967 | Carlon |
| 3,581,221 A | 5/1971 | Martin, Jr. |
| 3,908,170 A | 9/1975 | Buhler |
| 3,995,226 A | 11/1976 | Berning |
| 4,163,198 A | 7/1979 | Berning |
| 4,324,950 A | 4/1982 | Strickland |
| 4,918,394 A * | 4/1990 | Modafferi ...................... 330/3 |
| 4,987,381 A | 1/1991 | Butler |
| 5,302,912 A | 4/1994 | Grant |
| 5,450,034 A | 9/1995 | Werrbach |
| 5,705,950 A * | 1/1998 | Butler .......................... 330/3 |
| 5,727,069 A | 3/1998 | Hughes et al. |

OTHER PUBLICATIONS

Hamm, Russell O., Tubes Versus Transistors is There an Audible Difference? Journal of the Audio Engineering Society, May 1973, vol. 21, No. 4, pp. 267–273.

* cited by examiner

Primary Examiner—Steven J. Mottola
(74) Attorney, Agent, or Firm—Ramon L. Pizzaro; Edwin H. Crabtree

(57) ABSTRACT

A musical amplifier that includes a vacuum tube and a transistor. The vacuum tube is connected to the gate of the transistor, so that the current flow through the transistor is controlled by the vacuum tube. According to one example of the invention, the vacuum tube-transistor arrangement is set up in a "push-pull" arrangement, where a vacuum tube-transistor combination controls positive voltages, and another vacuum tube-transistor combination controls the negative voltages delivered by the system, the system output being at approximately zero voltage when not under load. Also, the use of the "Edison effect," referred to as "thermionic emission" from vacuum tubes to variably regulate output transistor bias current resulting in substantially reduced total harmonic distortion is also disclosed.

20 Claims, 3 Drawing Sheets

HYBRID AUDIO AMPLIFIER

BACKGROUND OF THE INVENTION (a) Field of the Invention

This invention generally relates to an audio or musical amplifier. More particularly, but not by way of limitation, to an amplifier that uses vacuum tubes to control the output of transistors used in the processing of electrical signals that are to be used to drive audio equipment.

(b) Discussion of Known Art

The development of transistors allowed designers of musical or audio amplifiers to take advantage of the linear response characteristics of these devices in order to create musical, analog electrical signal amplification systems that exhibit very low distortion characteristics. These distortion characteristics are often used as parameters by which the fidelity or performance of a particular amplifier is measured. Therefore, using these parameters, transistor based devices, such as solid state amplifiers or even digital signal processing units that use transistor based amplifiers to drive speakers or the like, appear as being the logical optimal choice for sound reproduction. However, research has found that these rigidly linear amplification systems tend to amplify signals or sounds that are unpleasant to the ear with equal emphasis as the signals or sounds that are pleasing to the ear. Specifically, it is well accepted that the odd order harmonic distortion of a particular sound signal will be perceived as a harsh or un-musical sound by the human ear, whereas similar magnitude of distortion of even order harmonics is often perceived a coloring or enriching of the depth of the sound produced.

Still further, the load characteristics of an electromechanical device, such as a loudspeaker with coil activated components, produces complex electrical loading patterns that are difficult to model. Thus, the precise "psychoacoustic" behavior of a particular sound amplifier is often difficult to model in mathematical terms, but must be ascertained by actually listening to the system in operation. This aspect of evaluation of music or sound amplifiers is recognized in the article by Russell O. Hamm, titled *Tubes Versus Transistors-Is There an Audible Difference?* and published in the Journal of the Audio Engineering Society, May 1973, Volume 21, Number 4, pp.267–273, incorporated herein in its entirety by reference.

Known solid-state transistor designs offer advantages in that these devices provide high current delivery characteristics that allow solid state or transistor based amplifiers to drive speakers without the limitations of similar duty vacuum tube designs. Some the limitations of known vacuum tube designs include the large, lethal voltages required to produce a device that can supply enough current to drive loudspeakers and the like. Additionally, the large vacuum tubes and accompanying high voltage power supply required to bias or power the vacuum tubes that can drive large electromechanical devices, such as loudspeakers, can be prohibitively heavy and expensive.

Therefore, a review of known devices reveals that there remains a need for an amplifier that can provide the advantages of vacuum tube based designs and the current or power delivery advantages of transistor designs.

There remains a need for a sound amplifier that delivers the coloration and emphasis to sound as supplied by vacuum tube amplifiers while providing the power delivery characteristics, as well as the size, voltage, and weight characteristics of transistor based designs.

There remains a need for a device and method for multiplying the sonically desirable current transfer characteristics of vacuum tubes.

There remains a need for an amplifier design that allows reduction of manufacturing costs by utilizing conventional transistor design components that are controlled by vacuum tube components to create a system that exhibits vacuum tube performance.

There remains a need within an open loop or zero negative global feedback amplifier a variable system of increasing output transistor bias during crossover condition and alternately reducing output transistor bias during large signal operation in order to reduce total harmonic distortion (THD).

SUMMARY

It has been discovered that the problems left unanswered by known art can be solved by providing an amplifier design that includes:

a vacuum tube;

a transistor, the transistor including a gate that controls the flow of current through the transistor, the vacuum tube being connected to the gate of the transistor, so that the current flow through the transistor is controlled by the vacuum tube. According to one example of the invention, the vacuum tube-transistor arrangement is set up in a "push-pull" arrangement, where a vacuum tube-transistor combination controls positive voltages, and another vacuum tube-transistor combination controls the negative voltages delivered by the system, the system output being at approximately zero voltage when not under load.

It is also contemplated that signals to be amplified will be received by a vacuum tube, which will then react to this signal and control the flow of current through the transistor in response to this input signal. The input of the vacuum tube is wired such that the plate and the grid of the vacuum tube are connected to one another either directly or via a DC (Direct Current) component such as a resistor, diode or transistor and to the input signal. While this arrangement generally contemplates the use of vacuum tubes with a triode structure, other vacuum tube structures including the most simple diode type tubes may also be used. These other structures would also employ the primary control grid (if supplied) and additional grids or accompanying or enhancing structures by connections to the plate of the vacuum tube either directly or via common DC components.

Another important example of inventive concepts taught herein employs one of the most basic operating characteristics of vacuum tubes in a new and novel manner in order to significantly improve and enhance the operation of the invention. This vacuum tube characteristic was formerly called the "Edison effect", disclosed in patents to Thomas A. Edison in 1883, but is now referred to as "thermionic emission."

In a typical modern vacuum tube, thermionic emission occurs when the electron-emitting structure or cathode is heated. The heated cathode emits free electrons in close proximity and creates around itself what may be described as an "electron cloud." The freely moving electrons within this electron cloud impinge themselves upon other structures within their immediate proximity, especially the plate. Thermionic emissions from the heated cathode have the measurable effect of increasing the potential voltage on the cathode as negatively charged electrons are emitted, and decreasing the potential voltage on other proximate electrodes and structures within the tube, especially the plate, which is purposefully designed as a very efficient receiver of such electrons.

According to another important aspect of the invention taught herein, illustrated herein as FIG. 2, which shows a novel method to utilize such thermionic emissions from vacuum tubes to variably regulate output transistor bias current resulting in substantially reduced THD. Specifically, this novel use of vacuum tube thermionic emissions is especially helpful during the wellknown and problematic conditions of signal "crossover" within typical A-B style, push-pull amplifiers and also during "large signal output" conditions.

Properly utilized within the invention, vacuum tube thermionic emission properties may provide the means to variably increase output transistor bias voltage and current during crossover periods and alternately decrease output transistor bias voltage and current during large signal operation. The overall result is typically an order of magnitude less THD. The new method of utilizing vacuum tube thermionic emissions taught herein to provide a means of variable bias voltage and current for the output transistors greatly enhances the invention and provides for an improved "open loop" or "zero negative global feedback" version of a vacuum tube hybrid audio amplifier.

According to yet another important invention taught herein, a vacuum tube with auxiliary illumination is also disclosed. This arrangement includes the structure commonly found in well-known vacuum tubes, being a base, connectors, and glass tube, and an illumination component. According to a method taught herein, the illumination component is positioned in close proximity to the glass tube of the vacuum tube. With this arrangement the illumination component servers to provide enhanced illumination to the vacuum tube, further-enhancing the colored illumination given off by many vacuum tubes during operation.

According to one example of the system using an illumination component, the illumination component is incorporated as a part of the base of the vacuum tube. Thus, it is contemplated that an illumination device, such as a light emitting diode (LED), is incorporated directly into the base of the vacuum tube. This arrangement allows the improved vacuum tube disclosed herein directly into a commercially available socket used to mount the vacuum tube onto the circuitry of the amplifier or other device. It is contemplated that the power to operate the LED, or other illumination component, would be drawn from one or more of the pins on the base of the vacuum tube. A voltage and/or current reducing element, for example a resistor, would be used to reduce the voltage drawn from the pins on the base.

As will be discussed further, below, it is contemplated that the LED, or other illumination component, may be positioned within the glass tube, or next to it on the base. An important new and useful result that is achievable with this arrangement is the indication of the fact that current is available to the tube that includes the disclosed illumination system. This solves a problem that is inherent in vacuum tubes, and that is that the vacuum tubes do not become operation the instant that power is delivered to the tube. The emitter of a vacuum tube must achieve the proper operating temperature before it becomes fully functional. Thus, the user would have to wait until the tubes warmed up before the user could determine whether the vacuum tube is connected to electrical power.

It is further contemplated that the illumination component would be of a type that emits light that approximates the color of the light naturally given off by a fully operational vacuum tube. Of course, it is also contemplated that the light-emitting device may be of any color and used to provide additional visual information to the user. For example, additional LEDs may be imbedded into the base of the vacuum tube and circuitry that is responsive to the voltage drop across selected terminals of the vacuum tube may then be incorporated to illuminate different colored or selected LEDs for a visual indicator of the operation or load being delivered through the vacuum tube, etc. Ideally, these LEDs would be positioned in an inconspicuous location, so that the overall appearance of the vacuum tube is not altered.

It should also be understood that while the above and other advantages and results of the present invention will become apparent to those skilled in the art from the following detailed description and accompanying drawings, showing the contemplated novel construction, combinations and elements as herein described, and more particularly defined by the appended claims, it should be clearly understood that changes in the precise embodiments of the herein disclosed invention are meant to be included within the scope of the claims, except insofar as they may be precluded by the prior art.

DRAWINGS

The accompanying drawings illustrate preferred embodiments of the present invention according to the best mode presently devised for making and using the instant invention, and in which:

FIG. 1 is a schematic diagram of an example of the disclosed invention used to create a push-pull arrangement for an amplifier incorporating the invention.

FIG. 2 example of the disclosed invention which also incorporates an "open loop" or "zero negative feedback" push-pull arrangement and utilizes vacuum tube "thermionic emissions" to produce variable output transistor biasing and reduced THD. Also illustrated are additional "darlington" configured supplemental signal driving transistors that allow optimal use of tube thermionic emissions and allow for simplified balancing and matching of various types of power output devices to a wide choice of driving vacuum tube types. Therefore, by adjusting the values of the coupling components and carefully selecting tube and transistor types, many combinations may be successfully matched and utilized within the invention.

DETAILED DESCRIPTION OF PREFERRED EXEMPLAR EMBODIMENTS

While the invention will be described and disclosed here in connection with certain preferred embodiments, the description is not intended to limit the invention to the specific embodiments shown and described here, but rather the invention is intended to cover all alternative embodiments and modifications that fall within the spirit and scope of the invention as defined by the claims included herein as well as any equivalents of the disclosed and claimed invention.

Figure 1:
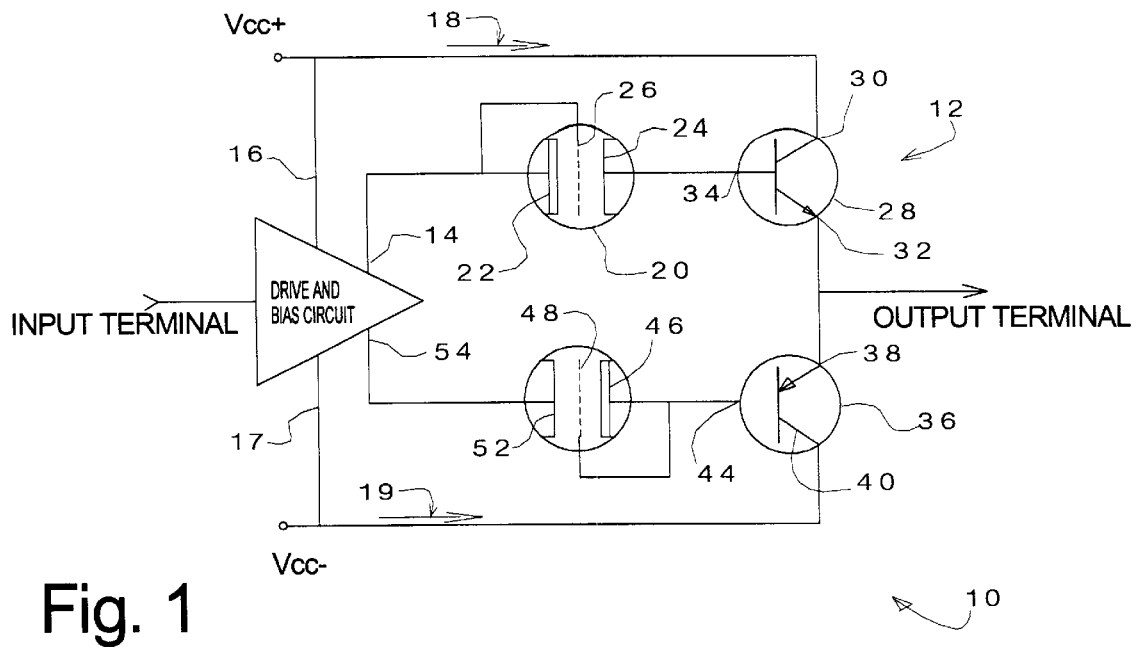

Turning now to FIG. 1 where a circuit 10 incorporating the disclosed invention has been illustrated in schematic form. The circuit 10 carries out the function of an audio musical amplifier system 12 that imparts a vacuum tube sound or quality on a sound signal, represented by an analog signal to be amplified through the system. FIG. 1 illustrates an Input Terminal for the acceptance of an input signal, which represents an analog or musical electronic signal to be reproduced with the use of a speaker or similar device. The illustrated circuit also shows a Drive And Bias Circuit which operates from supply voltage and current from Vcc+ and Vcc− sources of DC power by connections 16 and 17 respectively. Typically these voltages may range from 25 to 100 Volts or more at supply currents of up to 10 amps or more for high power amplifiers. The Drive and Bias Circuit provides outputs of positively biased voltage signal source 14 and negatively biased voltage signal source 54 to provide necessary drive and voltage for the vacuum tubes 20 and 50. Vcc+ and Vcc− also provide operating voltage and current for output transistors 28 and 36 via supply rails 18 and 19. The Output Terminal supplies the signal to drive the speaker or other device.

As illustrated in FIG. 1, the amplifier system 12 includes a first vacuum tube 20, which includes a plate 22, a cathode 24, and a grid 26 that is positioned between the plate 22 and the cathode 24. The plate 22 and the grid 26 of the first vacuum tube 20 are connected to one another and to the positively biased voltage signal source 14.

In the example of FIG. 1, Vcc+ is delivered to a NPN type first power transistor 28 via the positive voltage rail 18. The first power transistor 28 includes a collector 30, an emitter 32, and a base or gate 34 that is used to control the current flow from the collector 30 to the emitter 32 in response to a positively biased voltage presented to the base or gate 34. The term base or gate 34 has been used here to indicate that it is contemplated that various types of transistors may be used with the disclosed system, this includes MOSFET, IGBT or BJT, which often include the term base or gate to indicate the component that is used to control the flow of current through the device.

As illustrated in FIG. 1, the positively biased voltage signal source 14 is connected to the plate 22 and the grid 26 of the first vacuum tube 20. As illustrated, it is contemplated that this connection be accomplished by connecting the plate 22 and tthe grid 26 of the first vacuum tube 20 to one another and then to the positively biased voltage signal source 14. The cathode 24 of the first vacuum tube 20 is connected to the base or gate 34 of the first power transistor 28.

In operation, the positive voltage signal source 14 is used to drive the plate 22 and grid 26 of the first vacuum tube 20. The presence of a continuous positive bias voltage and current upon the grid 26 and plate 22 causes the first vacuum tube 20 to operate in a "fully on" near overload or saturated condition wherein the tube transmits a small amount of current. Since the cathode 24 of the first vacuum tube 20 is directly connected to the base or gate 34, the voltage variations introduced by the positively biased voltage signal source 14 controls the current transfer achieved through the first transistor 28. This allows the first transistor 28 to operate as a current multiplier. By then connecting the emitter 32 or output of the first transistor 28 to a device such as a speaker, a sonic output is created from the speaker corresponding to the use of a much more powerful vacuum tube. Thus, the first transistor 28 acts as a voltage follower, controlling the flow of current to the speaker load in response to the voltage delivered through the first vacuum tube 20, and creates a system that exhibits the output characteristics of a much larger, more powerful vacuum tube.

As discussed thus far regarding FIG. 1, those skilled in the art will recognize that a single-ended class A type amplifier circuit has essentially been described. However, in order to produce a more powerful and efficient sound amplifier that utilizes the advantages of both Vcc+ and Vcc−, a push-pull or A-B amplifier has been illustrated. This is achieved by incorporating a second power transistor 36, which also includes an emitter 38, a collector 40, and a base or gate 44 and is of opposite polarity of the first transistor 28. As illustrated, the second transistor 36 is oriented such that the emitter 38 of the second transistor 36 is connected to the emitter 32 of the first transistor 28. The base or gate 44 of the second transistor 36 is in turn connected to the plate 46 and grid 48 of a second vacuum tube 50. The cathode 52 of the second vacuum tube 50 is in turn connected to a negatively biased voltage signal source 54. As with the first tube 20 the presence of a continuous negative bias voltage and current upon the cathode 52 causes the second vacuum tube 50 to operate in a "fully on" near overload or saturated condition wherein the tube transmits a small amount of current.

Thus, it will be appreciated that the disclosed circuit provides high current transfer characteristics for high power output and low distortion. Bi-polar bias/driving circuits are employed that produce necessary positive and negative biasing, driving voltages and currents. These types of bias/driving circuits are often found in conventional push-pull transistorized amplifiers. However, instead of directly connecting these drive circuits to typical emitter follower pair(s) of power output transistors, a properly oriented vacuum tube for each excursion of signal polarity is placed between the bias/drive circuits and the respective emitter follower output transistor pair(s).

It will be further appreciated that the disclosed invention produces a condition wherein the speaker output load is presented as a reduced and mirrored load to the output side of each tube in an essentially consistent linear ratio. A typical bi-polar silicon power transistor may have a current gain of between 20 and 100 times. This means that if there were a collector to emitter current flow of 1 amp through a particular transistor, its base current may be between 10 and 50 mA. Since the current transfer ratio from the base to the emitter of conventional silicon power transistors is essentially constant and linear, it is possible to properly and match the optimum current transfer characteristics of a particular vacuum tube with those of a particular power transistor for desired operational results.

Thus, the invention utilizes the unique current transfer characteristics of near overloaded or saturated vacuum tubes driving a bi-polar transistorized push-pull output circuit. A consistent and linear portion of the output emitter load current from the speaker is directly mirrored back to the output terminal of each tube via the constantly proportional base current of each respective output transistor.

Thus the first vacuum tube 20 together with the second vacuum tube 50 are DC-coupled (Direct Current) to the bases of the power transistors, meaning the NPN first transistor 28 and the PNP second transistor 36, respectively. Since within each tube there is always positive grid bias with respect to the cathode, the transistor driving tubes are constantly operating under a fully "on," near-overload or saturated condition. Consequently, the vacuum tubes do not need any conventional tubetype high voltage power supplies. Sufficient signal current transfer within the tubes is fully achieved through natural thermionic emission resulting from the heated cathodes. In fact, the only power supply the tubes require in this configuration is a simple regulated low voltage supply (typically 6.3 or 12.6 volt) for their heater filaments. This type of tube filament power supply is commonly known to those skilled in the art.

Thus, it will be understood that the disclosed invention includes a method of multiplying the sonically desirable current transfer characteristics of vacuum tubes, arranging the vacuum tubes in a push-pull arrangement. This is done by directly coupling a pair of tubes in a bi-polar fashion to the bases of a conventional pair of complimentary power transistors wired as emitter followers.

Figure 2:
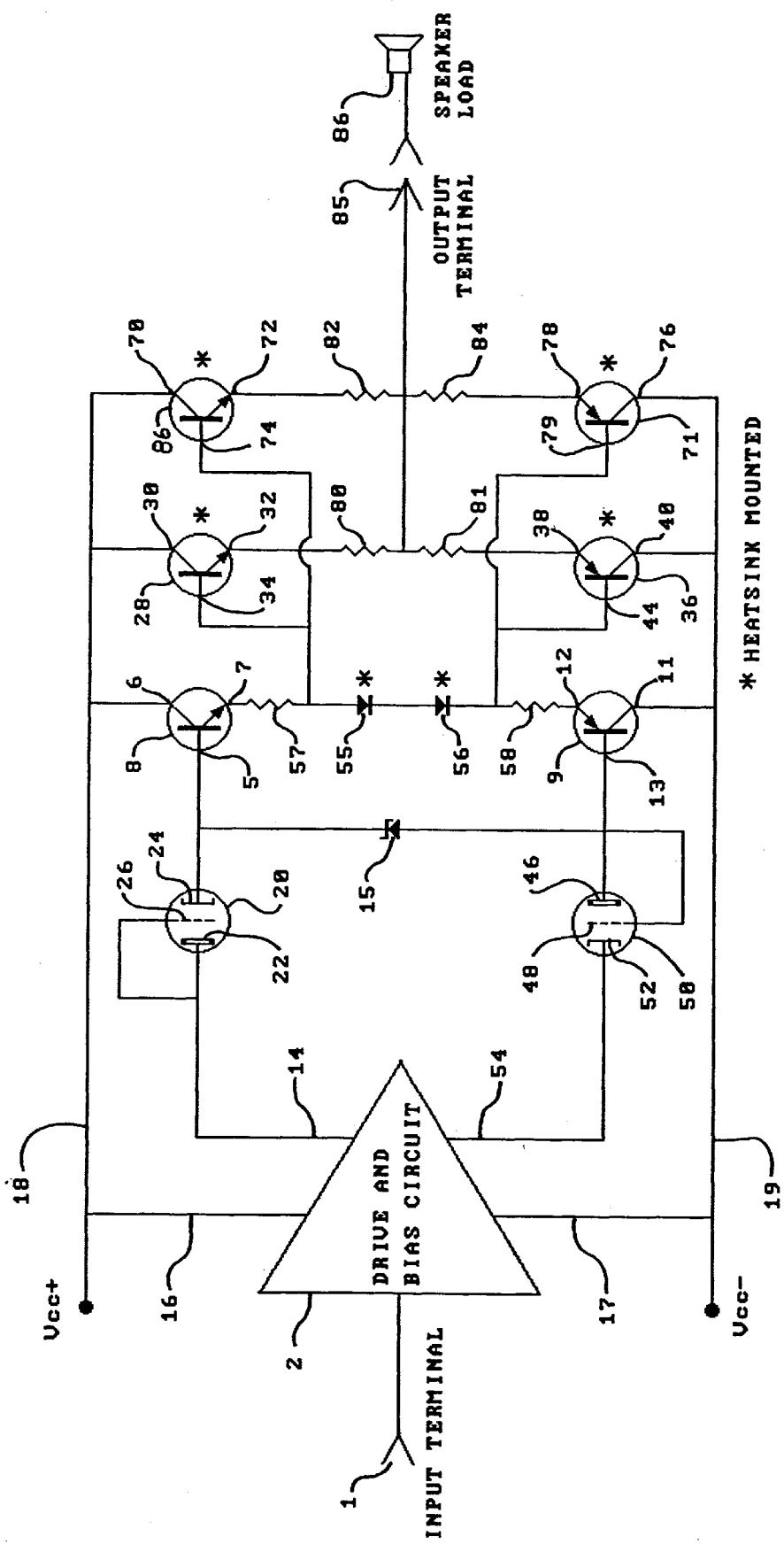

FIG. 2 is an additional push-pull or A-B version of the invention which includes multiple pairs of emitter follower power transistors for increased output power and current boosting darlington configured transistors which also allow reflected output load current back to the driving tubes. It will be appreciated that the driving tubes may therefore operate under reduced load current conditions as compared with the circuit illustrated in FIG. 1, due to the additional current gain supplied by the darlington configured transistors. This circuit configuration further enables thermionic emission voltages and currents generated within the vacuum tubes to supply useful additional bias voltage and current during output transistor "crossover" conditions. Also, as the output signal magnitude is driven towards either the positive or negative supply voltage rail, the relatively small thermionically generated bias voltage within the vacuum tubes is gradually overcome by increasing large signal driving bias voltage and current demand which is supplied through the tubes from the Drive and Bias Circuit. Therefore, during large signal operation, this reduction in the thermionically generated bias voltage and current reduces distortion which otherwise would be produced by excessive fixed biasing. Therefore the net operative effect utilized from the thermionic emission action within the tubes is active and variable output transistor biasing, which reduces over all distortion in the circuit. This novel variable biasing aspect of the invention becomes especially beneficial when the tube hybrid circuit is operated in an "open loop" or "zero global negative feedback" mode as shown.

Traditional "open loop" push-pull A-B amplifiers utilizing typical constant voltage biasing methods suffer from increased crossover distortion due to too little fixed biasing, or they suffer from increased large signal distortion resulting from too much fixed biasing. However, as taught herein, careful utilization of the thermionic emissions created within the driving tubes, bias output voltage may essentially be automatically and variably regulated in proportion to the need for increased output bias voltage at or surrounding the crossover point of circuit operation, and alternately variably reduced during large signal operating conditions. In laboratory tests, an order of magnitude (10 times) less THD or better has typically been observed by properly utilizing the thermionic emissions from the driving vacuum tubes to provide variable output transistor biasing as taught herein.

For example, measurements taken with a Hewlett Packard Model 8903B Audio Analyzer produced the following typical distortion measurements:

Frequency=1000 Hz.

Output Power=100 Watts, RMS

THD without thermionic emission supplemental bias: 0.80%

THD with thermionic emission supplemental bias: 0.06%

A suitable musical or analog input signal is connected to the Input Terminal 1. Drive and Bias Circuit 2 produces a positively biased drive signal 14 which is connected to the plate 22 and control grid 26 of positive drive tube 20. Tube 20 adds tube characteristics to the positive drive signal and provides an output at cathode 24. Cathode 24 of tube 20 is connected to the base of NPN darlington configured transistor 8. Transistor 8 is connected to the Vcc+ rail 18 through collector 6. Signal output from transistor 8 is then supplied via emitter 7, directly coupled through emitter resistor 57 and connected to bases 34 and 74 of NPN output transistors 28 and 86 respectively. NPN output transistors 28 and 86 receive their supply voltage and current from Vcc+ rail 18 and according to the drive signal presented to their bases 34 and 74 produce current-boosted output signal through their emitters, 32 and 72 respectively. Emitter 32 is directly coupled through emitter resistor 80 and emitter 72 is directly coupled through emitter resistor 82. Output from emitter resistors 80 and 82 are then connected to the Output Terminal 85.

Negatively biased driving signal 54 is connected to the cathode 52 of negative drive tube 50. Tube 50 adds tube characteristics to the negative drive signal and provides an output at plate 46. Control grid 48 and plate 46 of tube 50 are connected to the base of PNP darlington configured transistor 9. Transistor 9 is connected to the Vcc− rail through collector 11. Signal output from transistor 9 is then supplied via emitter 12, directly coupled through emitter resistor 58 and connected to bases 44 and 79 of PNP output transistors 36 and 71 respectively. PNP output transistors 36 and 71 receive their voltage and current from Vcc− rail 19 and according to the drive signal presented to their bases 44 and 79 and produce current-boosted output signal through their emitters, 38 and 78 respectively. Emitter 38 is directly coupled through emitter resistor 81 and emitter 78 is directly coupled through emitter resistor 84. Output from emitter resistors 81 and 84 are then connected to the Output Terminal 85. Output Terminal 85 supplies the push pull or A-B output signal to speaker 86 or other desired load.

It will be appreciated that under "no signal" or "low signal" input signal level conditions, in addition to primary Drive and Bias Circuit output sources 14 and 54, thermionic emissions produce additional bias voltages within both tube 20 and tube 50. During no signal or low signal conditions, the plate voltages within both tube 20 and tube 50 each become more negative compared to their respective cathodes 24 and 52. Therefore under no signal or low signal conditions, the bias voltage presented to the base 5 of NPN transistor 8 from the cathode 24 of tube 20 becomes more positive and correspondingly, the bias voltage presented to the base 13 of PNP transistor 9 from the plate 46 of tube 50 may becomes more negative due entirely from thermionic emission voltages and currents produced within each tube. The combined effect of these thermionic emission voltages and currents results in an absolute value increase of combined output transistor bias voltage at low signal levels. This results in significantly reduced crossover distortion. This discovery is especially useful in this version of the invention due to the "open loop" or "zero negative feedback" design. Conventional or "closed loop" designs generally utilize large amounts of negative feedback to reduce crossover distortion with sonic disadvantages.

It is also important to realize that as signal levels presented to the driving tubes are increased, the correspondingly increased current demands from the speaker or other output load is reflected from the load through the output transistors and darlington transistors and proportionately back to the driver tubes. Increased signal load demand on the tubes gradually causes their thermionic emission voltages and currents to be overwhelmed, and power output transistor biasing becomes increasingly supplied from the main biasing signal sources 14 and 54. At large signal output conditions, this results in less absolute bias voltage to the output transistors and yields reduced large signal distortion. This novel characteristic is especially desirable within this open loop or zero negative feedback design. As with crossover distortion, conventional designs have also relied upon large amounts of closed loop negative feedback to correct large signal distortion.

A multiple of both positive output power transistors 28 and 86 and negative transistors 36 and 17 may be utilized for increased output power and performance. It is important to note that a conventional "voltage follower" type output has been illustrated, but it is anticipated that other types of output power device configurations could be employed within the scope of the invention. This would include the obvious variant of "common collector" power output to those skilled in the art.

The heart of the matter becomes the novel use of bilaterally loaded vacuum tubes employed to control output devices, especially bipolar transistors and the like, to mirror and produce fully-on vacuum tube saturated characteristics into the speaker or load. Therefore the invention produces practical sonic results which would be expected from direct-coupled complimentary bi-polar power vacuum tubes of great size and capacity. But current state of the art is not capable of producing vacuum tubes that are negatively complimentary. This invention further teaches that by carefully controlling thermionic emission characteristics within the vacuum tubes (in this example by including darlington configured transistors), it is possible to significantly reduce both crossover and large signal THD.

Under certain conditions of operation it has been noted that it is desirable to include additional components to enhance the safe and durable operation of the amplifier. The main function of equal value emitter resistors 57 and 58 is to optimize and balance the safe operating current drive requirements of the output transistors with the current transfer characteristics of darlington configured transistors 8 and 9. The value of resistors 57 and 58 also affects the thermionic emission requirements from tubes 20 and 50 to drive darlington configured transistors 8 and 9. Diodes 55 and 56 are illustrated as one method of safeguarding the output transistors against an over-bias condition which possibly could result from excessive thermionic emissions from tubes 20 and 50 or an abnormal thermal runaway condition within darlington configured transistors 8 or 9. Diodes 55 and 56 (or other type temperature reactive devices such as a negative temperature coefficient (N.T.C.) thermistor) may be mounted upon a common heatsink with output transistors within this part of the circuit to provide protective thermal tracking. Another potential method of limiting excessive thermionic emissions from tubes 20 and 50 is shown as zener diode 15 connected between cathode 24 of tube 20 and plate 46 of tube 50. Conventional DC power supplies Vcc+ and Vcc− are employed to supply sufficient current and voltage for the desired maximum output power requirements. In some cases, it may desirable to operate the circuit illustrated herein with separate and differing levels of Vcc+ and Vcc− for the Drive And Bias Circuit 2 and the darling transistors 8 and 9 and output transistors 20,86,36 and 71.

That is, there may be a Vcc1+ and Vcc1− to operate the Driver and Bias Circuit 2 and a Vcc2+ and Vcc2− to operate the darling transistors 8 and 9 and output transistors 20, 86, 36 and 71.

Figures 3, 4:
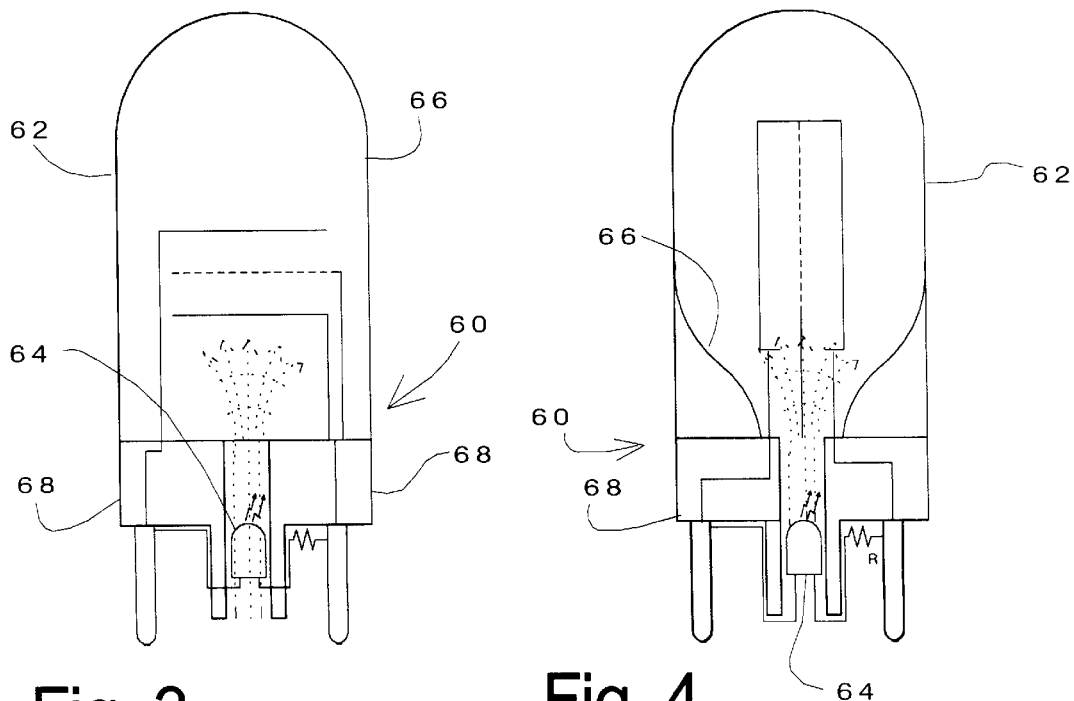
FIG. 3 is an example of the use of the disclosed illumination device or system used with a vacuum tube.
FIG. 4 illustrates another example of the disclosed illumination system for vacuum tubes.
Figure 3A:
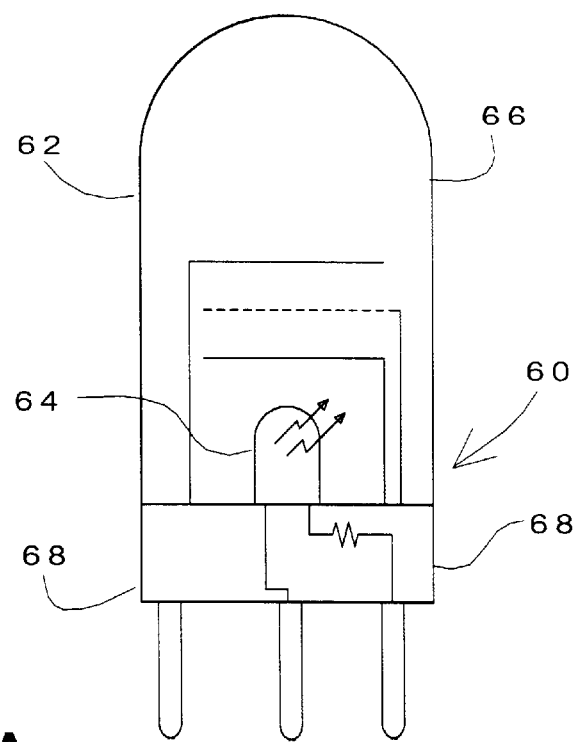
FIG. 3A is an example of the use of the disclosed illumination device or system used with a vacuum tube, the illustration showing the installation of the keyed terminal, after having bored out part of the keyed terminal so that it will accept the LED.
Figure 4A:
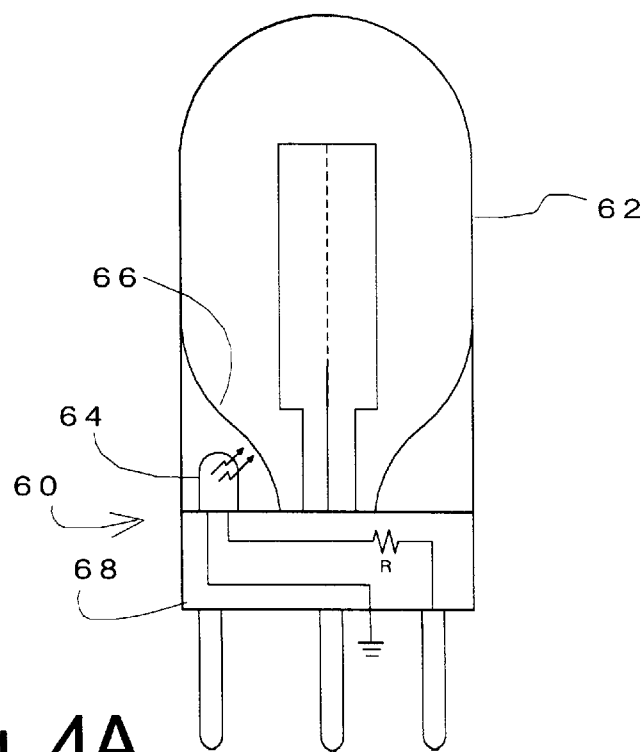
FIG. 4A is an example of the use of the disclosed illumination device or system used with a vacuum tube, the illustration showing installation within the keyed terminal, after having ground off or bored out part of the keyed terminal so that it will accept the LED.

It will be understood that an illumination system 60 has also been disclosed herein. The illumination system 60 may be built into the central keyed base terminal base of vacuum tube 62 or placed on a board next to the vacuum tube, with an LED or other illumination component focused on to the glass envelope of the vacuum tube. However, it is contemplated that the LED 64, or other illumination component, may be positioned within the central keyed base terminal. Existing tubes with such a central base keyed terminal may be modified to accept the insertion of the LED or illumination source also, as shown in FIG. 3 and FIG. 4. The illumination device could also be placed or manufactured within the glass tube 66 as shown in FIG. 3A, or within or on the base and adjacent to the outer surface of the glass tube 66, as shown in FIG. 4A. The placement of the LED on the base 68, next to the glass tube 66 may be also be accomplished by providing an aperture through the base 68.

Thus it can be appreciated that the above-described embodiments are illustrative of just a few of the numerous variations of arrangements of the disclosed elements used to carry out the disclosed invention. Moreover, while the invention has been particularly shown, described and illustrated in detail with reference to preferred embodiments and modifications thereof, it should be understood that the foregoing and other modifications are exemplary only, and that essentially equivalent changes in form and detail may be made without departing from the true spirit and scope of the invention as claimed, except as precluded by the prior art.

What is claimed is:

1. A musical amplitier for imparting a vacuum tube characteristic on a signal to be amplified through a transistor, the amplifier comprising:

a first vacuum tube having a cathode, an anode, and a grid positioned between the cathode and the anode, the cathode and the grid of said first vacuum tube being directly connected to one another;

a first transistor having an emitter, a collector, and a base or gate, the base or gate of said transistor being connected to the anode of said first vacuum tube, so that the signal to be amplified through a transistor is amplified by said first transistor in response to a signal delivered from the anode of said second vacuum tube, thereby imparting vacuum tube quality to the negative signal as amplified through the first transistor.

2. An audio musical amplifier according to claim 1 and further comprising:

a second vacuum tube having a cathode, a plate, and a grid positioned between the cathode and the plate, the plate and the grid of said second vacuum tube being connected to one another;

a second transistor having an emitter, a collector, and a base or gate, the base or gate of said second transistor being connected to the plate and grid of said second vacuum tube, and the emitter of the second transistor being connected to the emitter of said first transistor so that a negative signal to be amplified through a transistor is amplified by said second transistor in response to a signal delivered from the plate of said second vacuum tube, thereby imparting vacuum tube quality to the negative signal as amplified through the second transistor.

3. An audio musical amplifier according to claim 2 and further comprising an output between the emitter of the first transistor and the emitter of the second transistor, so that signals to be amplified are amplified in a push-pull manner.

4. A method for creating a musical amplifier tor imparting a vacuum tube characteristic on a signal to be amplified through a transistor, the method comprising:

providing an amplifier comprising:
a first vacuum tube having a cathode, an anode, and a grid positioned between the cathode and the anode, the cathode and the grid of said first vacuum tube being directly connected to one another; and a first transistor having an emitter, a collector, and a base or gate; and attaching the base or gate of said first transistor to the anode of said first vacuum tube, so that the signal to be amplified through a transistor is amplified by said first transistor in response to a signal delivered from the anode of said first vacuum tube, thereby imparting vacuum tube quality to the negative signal as amplified through the first transistor.

5. A method according to claim 4 and further comprising:
providing a second vacuum tube having a cathode, a plate, and a grid positioned between the cathode of the second vacuum tube and the plate of the second vacuum tube;

attaching the plate of said second vacuum tube to the grid of said second vacuum tube;

providing a second transistor having an emitter, a collector, and a base or gate;

connecting the base or gate of second transistor to the plate and grid of said second vacuum tube, and connecting the emitter of the second transistor to the emitter of the first transistor so that a negative signal to be amplified through a transistor is amplified by said second transistor in response to a signal delivered from the plate of said second vacuum tube, thereby imparting vacuum tube quality to the negative signal as well as the positive signal.

6. A hybrid amplifier circuit of the type having amplifier input and output ports for inputting and outputting an audio signal, the amplifier circuit comprising:

a signal amplifying, bias and driving stage adapted for coupling to the amplifier input port and amplifying, bias and driving stage having both positively and negatively biased signal output ports;

a first triode vacuum tube having a cathode, a plate and a control grid, the plate and the control grid being coupled to said positively biased output port and having a positive tube drive signal output port connected to the cathode;

a second triode vacuum tube having a cathode, a plate and a control grid, the cathode of the second triode vacuum tube being coupled to said negatively biased signal output port and having a negative tube drive signal output port connected to the plate and control grid of the second triode vacuum tube;

a first darlington configured transistor having a base, an emitter and a collector, the base of the first darlington being coupled to the cathode of said first triode vacuum tube;

a second darlington configured transistor having a base, an emitter, and a collector, the base of the second darlington being connected to the plate and control grid of said second triode vacuum tube;

a first power output transistor having a base, an emitter, and a collector, the base of the first power output transistor being coupled to the emitter of said first darlington configured transistor;

a second power output transistor having a base, an emitter, and a collector, the base of the second power output transistor being coupled to the emitter of said second darlington configured transistor, so that said output port is connected to the emitter of said first power output transistor and the emitter of said second power output transistor.

7. The amplifier circuit of claim 6 wherein said bias and driving stage comprises an integrated circuit operational amplifier.

8. The amplifier circuit of claim 6 wherein said bias and driving stage comprises a discrete transistorized amplifier.

9. The amplifier circuit of claim 6 wherein said bias and driving stage comprises a discrete transistorized balanced differential amplifier.

10. The amplifier circuit of claim 6 wherein said bias and driving stage comprises a discrete transistorized operational amplifier.

11. The amplifier circuit of claim 6 wherein said bias and driving stage comprises an isolated or floating fixed voltage bipolar power supply with a zero voltage center tap connected to said amplifier input port.

12. The amplifier circuit of claim 6 wherein said first triode vacuum tube and said second triode vacuum tube are capable of being operated and biased to allow a thermionic emission to create an additional bias voltage and current between the plate and cathode of the first triode vacuum tube the plate and cathode of the second triode vacuum tube.

13. The amplifier circuit of claim 6 wherein said first and second triode vacuum tubes are capable of being operated to allow a thermionic emission to produce a plate voltage that is more negative than the respective cathode voltage.

14. The amplifier circuit of claim 6 wherein said voltages produced by a thermionic emission within said first and second triode vacuum tubes between their plates and respective cathodes are of greater magnitude during amplifier crossover output conditions and become of less magnitude during large signal amplifier output conditions.

15. The amplifier circuit of claim 6 wherein the plate voltage within first and the plate voltage of said second triode vacuum tubes are negative with respect to their cathodes during operating conditions.

16. The amplifier circuit of claim 6 wherein the said first and second triode vacuum tubes comprise a vacuum tube having no grid electrode.

17. The amplifier circuit of claim 6 wherein the said first and second output transistors are configured to operate in a common collector mode rather than an emitter follower mode.

18. The amplifier circuit of claim 6 wherein the first and second output transistors are of FET, MosFET, or IGBT types.

19. The amplifier circuit of claim 6 wherein said first and second darlington transistors are deleted and said tube drive signal output ports from said first and second vacuum tubes are coupled directly to the bases of said first and second output transistors.

20. The amplifier circuit of claim 6 wherein the cathode of said first triode vacuum tube is connected to an anode of a zener diode, the zener diode also having a cathode, and the plate of said second triode is connected to the cathode of said zener diode, so that the zener diode limits the magnitude of thermionic emission voltage between said first triode vacuum tube and said second triode vacuum tube.

\* \* \* \* \*